(12) United States Patent
Ding et al.

(10) Patent No.: US 11,790,689 B2
(45) Date of Patent: Oct. 17, 2023

(54) FINGERPRINT IDENTIFICATION SUBSTRATE, FINGERPRINT IDENTIFICATION METHOD AND DISPLAY DEVICE

(71) Applicant: BOE Technology Group Co., Ltd., Beijing (CN)

(72) Inventors: Xiaoliang Ding, Beijing (CN); Haisheng Wang, Beijing (CN); Yingming Liu, Beijing (CN); Yapeng Li, Beijing (CN); Jiabin Wang, Beijing (CN); Changfeng Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 17/611,496

(22) PCT Filed: Feb. 22, 2021

(86) PCT No.: PCT/CN2021/077256
§ 371 (c)(1),
(2) Date: Nov. 15, 2021

(87) PCT Pub. No.: WO2021/169919
PCT Pub. Date: Sep. 2, 2021

(65) Prior Publication Data
US 2022/0207908 A1    Jun. 30, 2022

(30) Foreign Application Priority Data

Feb. 24, 2020    (CN) .................... 202010112033.0

(51) Int. Cl.
*G06K 9/28*       (2006.01)
*G06V 40/13*     (2022.01)
(Continued)

(52) U.S. Cl.
CPC ........ *G06V 40/1318* (2022.01); *G06V 10/141* (2022.01); *H01L 27/14625* (2013.01); *H01L 27/14678* (2013.01); *H10K 59/65* (2023.02)

(58) Field of Classification Search
CPC .............. G06V 10/141; G06V 40/12–40/1394
See application file for complete search history.

(56) References Cited

U.S. PATENT DOCUMENTS 10,461,200 B1    10/2019    Wang et al.
2011/0222064 A1   9/2011    Umeda et al.
(Continued)

FOREIGN PATENT DOCUMENTS

CN    106897699 A    6/2017
CN    107832752 A    3/2018
(Continued)

OTHER PUBLICATIONS

PCT/CN2021/077256 international search report and written opinion.
CN 202010112033.0 first office action.

*Primary Examiner* — Brian Werner
(74) *Attorney, Agent, or Firm* — IPRO, PLLC (57) ABSTRACT

The present disclosure relates to the field of fingerprint identification technology, and provides a fingerprint identification substrate, a fingerprint identification method and a display device. The fingerprint identification substrate includes: a base substrate; at least one point light source arranged on the base substrate and configured to emit signal light; and at least one photosensitive unit arranged at a side of the base substrate away from the point light source, and configured to receive the signal light reflected by a finger and identify a fingerprint. Each photosensitive unit includes a first photosensitive sensor and a second photosensitive sensor independent of each other, a light filtration structure is arranged at a side of the second photosensitive sensor (Continued)

facing the point light source and configured to merely allow light in a first direction to pass therethrough, and the first direction is perpendicular to the base substrate.

19 Claims, 3 Drawing Sheets

(51) Int. Cl.
*G06V 10/141* (2022.01)
*H01L 27/146* (2006.01)
*H10K 59/65* (2023.01)

(56) References Cited

U.S. PATENT DOCUMENTS

| | | |
|---|---|---|
| 2019/0019850 A1* | 1/2019 | Xu .................. G06V 40/12 |
| 2019/0332841 A1 | 10/2019 | Zhou et al. |
| 2020/0210672 A1 | 7/2020 | Zhao et al. |
| 2020/0302142 A1 | 9/2020 | Liu et al. |
| 2021/0216739 A1 | 7/2021 | Li et al. |
| 2021/0334497 A1 | 10/2021 | Wang et al. |

FOREIGN PATENT DOCUMENTS

| | | | |
|---|---|---|---|
| CN | 108615019 A | 10/2018 |
| CN | 109583420 A | 4/2019 |
| CN | 109742097 A | 5/2019 |
| CN | 110569803 A | 12/2019 |
| CN | 110707140 A | 1/2020 |
| CN | 110770749 A | 2/2020 |
| CN | 111339915 A | 6/2020 |

* cited by examiner

Fig. 4 when a touch operation occurs, sequentially enabling a first point light source and a second point light source — 101 obtaining a residual electric signal of a second photosensitive sensor in a first photosensitive unit when the second point light source has been enabled, the first photosensitive unit being arranged in a non-imaging region of the first point light source and in an imaging region of the second point light source — 102 determining a residual electric signal of a first photosensitive sensor in accordance with a mapping relationship between the residual electric signal of the second photosensitive sensor and the residual electric signal of the first photosensitive sensor in the first photosensitive unit — 103 obtaining a detection electric signal of the first photosensitive sensor, and determining a fingerprint electric signal of the first photosensitive sensor in accordance with the residual electric signal of the first photosensitive sensor and the detection electric signal — 104 performing fingerprint identification in accordance with the fingerprint electric signal of the first photosensitive sensor — 105

Fig. 5

FINGERPRINT IDENTIFICATION SUBSTRATE, FINGERPRINT IDENTIFICATION METHOD AND DISPLAY DEVICE

CROSS-REFERENCE TO RELATED APPLICATIONS

This application is the U.S. national phase of PCT application No. PCT/CN2021/077256 filed on Feb. 22, 2021, which claims a priority of the Chinese patent application No. 202010112033.0 filed on Feb. 24, 2020, which is incorporated herein by reference in its entirety.

TECHNICAL FIELD

The present disclosure relates to the field of fingerprint identification technology, and in particular to a fingerprint identification substrate, a fingerprint identification method and a display device.

BACKGROUND

In current mobile consumption, electronic fingerprint identification becomes an indispensable part of a mobile terminal. In a point light source technology for fingerprint identification, after a point light source has been enabled, there are two image forming regions in a photosensitive sensor, one region is a non-imaging region in which no fingerprint is imaged, and the other is an imaging region in which the fingerprint is imaged. In order to obtain a complete fingerprint image, the non-imaging region needs to be filled, and two point light sources are used to realize complementary imaging. However, since the imaging regions of the two point light sources partially overlap each other, the point light sources need to be enabled in a time-division manner. Due to a lag problem for the photosensitive, when the first point light source is enabled, light from the first point light source directly reaches the photosensitive sensor, and when the second point light source is enabled, a strong lag will remain in the imaging region of the photosensitive sensor. In this way, an imaging effect is adversely affected, and thereby the accuracy of the fingerprint identification is adversely affected.

SUMMARY

An object of the present disclosure is to provide a fingerprint identification substrate, a fingerprint identification method and a display device, so as to ensure an imaging effect for the fingerprint identification, and improve the fingerprint identification accuracy.

In order to solve the above problem, the present disclosure provides the following technical solutions.

In one aspect, the present disclosure provides in some embodiments a fingerprint identification substrate, including: a base substrate; at least one point light source arranged on the base substrate and configured to emit signal light; and at least one photosensitive unit arranged at a side of the base substrate away from the point light source, and configured to receive the signal light reflected by a finger and identify a fingerprint. Each photosensitive unit includes a first photosensitive sensor and a second photosensitive sensor independent of each other, a light filtration structure is arranged at a side of the second photosensitive sensor facing the point light source and configured to merely allow light in a first direction to pass therethrough, and the first direction is perpendicular to the base substrate.

In a possible embodiment of the present disclosure, the light filtration structure includes a quarter-wave plate and a linear polarizer laminated one on another.

In a possible embodiment of the present disclosure, a photosensitive area of the first photosensitive sensor is larger than a photosensitive area of the second photosensitive sensor.

In a possible embodiment of the present disclosure, the photosensitive units correspond to the point light sources respectively.

In a possible embodiment of the present disclosure, the first photosensitive sensor and the second photosensitive sensor are photodiodes, each photodiode includes an anode, a cathode and an intrinsic layer between the anode and the cathode, the anode of the first photosensitive sensor and the anode of the second photosensitive sensor are independent of each other, and the intrinsic layer of the first photosensitive sensor and the intrinsic layer of the second photosensitive sensor are formed integrally.

In a possible embodiment of the present disclosure, the fingerprint identification substrate is an organic light-emitting diode (OLED) display substrate, and the point light source is a pixel of the OLED display substrate.

In a possible embodiment of the present disclosure, a quarter-wave plate and a linear polarizer are arranged on an encapsulation thin film at a light-exiting side of the fingerprint identification substrate to convert the signal light into circularly-polarized light.

In another aspect, the present disclosure provides in some embodiments a display device including the above-mentioned fingerprint identification substrate as described.

In yet another aspect, the present disclosure provides in some embodiments a fingerprint identification method for the above-mentioned fingerprint identification substrate, including: when a touch operation occurs, sequentially enabling a first point light source and a second point light source; obtaining a residual electric signal of a second photosensitive sensor in a first photosensitive unit when the second point light source has been enabled, the first photosensitive unit being arranged in a non-imaging region of the first point light source and in an imaging region of the second point light source; determining a residual electric signal of a first photosensitive sensor in accordance with a mapping relationship between the residual electric signal of the second photosensitive sensor and the residual electric signal of the first photosensitive sensor in the first photosensitive unit; obtaining a detection electric signal of the first photosensitive sensor, and determining a fingerprint electric signal of the first photosensitive sensor in accordance with the residual electric signal of the first photosensitive sensor and the detection electric signal; and performing fingerprint identification in accordance with the fingerprint electric signal of the first photosensitive sensor.

In a possible embodiment of the present disclosure, a photosensitive area of the first photosensitive sensor is larger than a photosensitive area of the second photosensitive sensor.

In a possible embodiment of the present disclosure, the mapping relationship between the residual electric signal of the second photosensitive sensor and the residual electric signal of the first photosensitive sensor in the first photosensitive unit is related to a proportion of the photosensitive area of the second photosensitive sensor to the photosensitive area of the second photosensitive sensor.

In a possible embodiment of the present disclosure, the fingerprinting method further includes obtaining the mapping relationship between the residual electric signal of the second photosensitive sensor and the residual electric signal of the first photosensitive sensor in each photosensitive unit.

In a possible embodiment of the present disclosure, the obtaining the mapping relationship includes: step a of enabling a point light source and disabling the point light source; step b of measuring a first residual electric signal of a first photosensitive sensor of a second photosensitive unit, the second photosensitive unit being arranged in the non-imaging region of the point light source; step c of measuring a second residual electric signal of a second photosensitive sensor of the second photosensitive unit; step d of determining a mapping relationship for the second photosensitive unit according to the first residual electric signal and the second residual electric signal; and repeating steps a to d until the mapping relationship for all the photosensitive units of the fingerprint identification substrate has been obtained.

REFERENCE SIGN LIST 1 non-imaging region
2 imaging region
3 first photosensitive sensor
4 second photosensitive sensor
5 photosensitive unit
6 encapsulation cover plate
7,13 linear polarizer
8,12 quarter-wave plate
9 encapsulation thin film
10 pixel
11 base substrate
14 light in a first direction
15 light reflected by a fingerprint
16 fingerprint

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
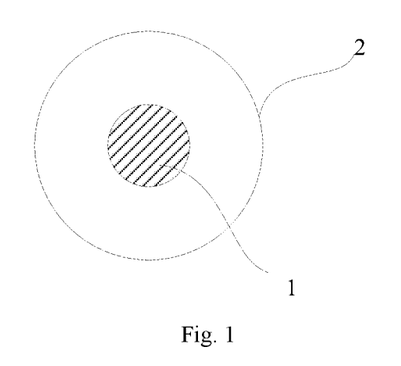
FIG. 1 and FIG. 2 are schematic views showing the imaging of a fingerprint through point light sources.

In a point light source technology for fingerprint identification, after a point light source has, as shown in FIG. 1, there are two image forming regions in the photosensitive sensor, one region is a non-imaging region 1 in which a fingerprint is not imaged, and the other region is an imaging region 2 in which the fingerprint is imaged. In order to obtain a complete fingerprint image, the non-imaging region needs to be filled.

Figure 2:
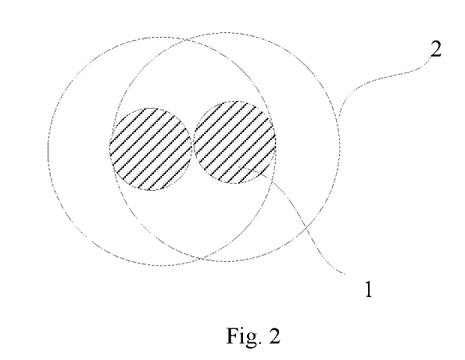

As shown in FIG. 2, two point light sources are used to realize complementary imaging, thereby to obtain the fingerprint image. However, since the imaging regions of the two point light sources overlap each other, the two point light sources are required to be enabled in a time-division manner, i.e., two adjacent point light sources need to be enabled sequentially. When the first point light source is enabled, light emitted by the first point light source directly reaches the photosensitive sensor below the first point light source, and a large electric signal is generated on the non-imaging region of the photosensitive sensor. When the second point light source is enabled, the former non-imaging region is changed into the imaging region, and a strong lag remains at the imaging region due to the large electric signal on the former non-imaging region. At this time, an imaging effect is adversely affected, and thereby the fingerprint identification accuracy is adversely affected.

An object of the present disclosure is to provide a fingerprint identification substrate, a fingerprint identification method and a display device, so as to ensure an imaging effect for the fingerprint identification, thereby to improve the fingerprint identification accuracy.

The present disclosure provides in some embodiments a fingerprint identification substrate, which includes: a base substrate; at least one point light source arranged on the base substrate and configured to emit signal light; and at least one photosensitive unit arranged at a side of the base substrate away from the point light source, and configured to receive the signal light reflected by a finger and identify a fingerprint. Each photosensitive unit includes a first photosensitive sensor and a second photosensitive sensor independent of each other, a light filtration structure is arranged at a side of the second photosensitive sensor facing the point light source and configured to merely allow light in a first direction to pass therethrough, and the first direction is perpendicular to the base substrate.

Figure 3:
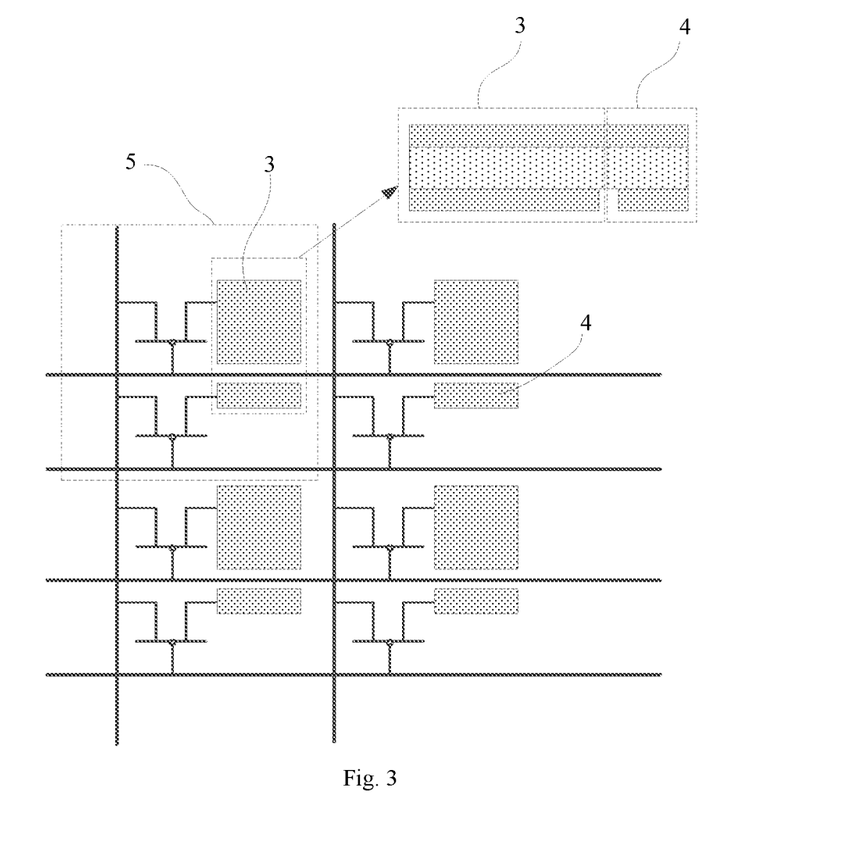
FIG. 3 is a schematic view showing a circuit structure of a fingerprint identification substrate according to one embodiment of the present disclosure.

As shown in FIG. 3, each photosensitive unit 5 includes a first photosensitive sensor 3 and a second photosensitive sensor 4 independent of each other. The light filtration structure is arranged at a side of the second photosensitive sensor facing the point light source and configured to merely allow light in the first direction to pass therethrough, and the first direction is perpendicular to the base substrate.

When a touch operation occurs, a first point light source and a second point light source are sequentially enabled. A non-imaging region corresponding to the first point light source covers an imaging region corresponding to the second point light source. When the second point light source is enabled, a residual electric signal of a second photosensitive sensor in the first photosensitive unit is obtained. The first photosensitive unit is arranged in the non-imaging region of the first point light source and in the imaging region of the second point light source. The light filtration structure is arranged at a side of the second photosensitive sensor in the first photosensitive unit facing the point light source, and the light filtration structure only allows the light in the first direction to pass therethrough. Hence, when the second point light source is enabled, light emitted by the second point light source and light reflected by a fingerprint do not reach the second photosensitive sensor, and the electric signal of the second photosensitive sensor is a residual electric signal generated on the second photosensitive sensor when the first point light source is enabled. In this way, through detecting the electric signal of the second photosensitive sensor, it is able to obtain the residual electric signal of the second photosensitive sensor, and then obtain the residual electric signal of the first photosensitive sensor in accordance with the residual electric signal of the second photosensitive sensor. The electric signal of the first photosensitive sensor is detected, and the electric signal of the first photosensitive sensor consists of the residual electric signal and a fingerprint electric signal. The fingerprint electric signal of the first photosensitive sensor is determined in accordance with the residual electric signal of the first photosensitive sensor and the detected electric signal of the first photosensitive sensor, and then fingerprint identification is performed in accordance with the fingerprint electric signal of the first photosensitive sensor.

According to the embodiments of the present disclosure, it is able to ensure an imaging effect for the fingerprint identification, thereby to improve the fingerprint identification accuracy.

In the embodiments of the present disclosure, the first photosensitive sensor is configured to obtain the fingerprint image. The second photosensitive sensor is configured to receive direct light from the point light source when the point light source is enabled for the first time to form a lag, and calculate a lag residue when the point light source is enabled for the second time. Hence, an area of the second photosensitive sensor does not need to be set too large, and a photosensitive area of the first photosensitive sensor may be larger than a photosensitive area of the second photosensitive sensor.

The photosensitive units correspond to the point light sources respectively, or a plurality of photosensitive units corresponds to one point light source.

In a possible embodiment of the present disclosure, as shown in FIG. 3, the first photosensitive sensor and the second photosensitive sensor may be photodiodes. Each photodiode includes an anode, a cathode and an intrinsic layer between the anode and the cathode, the anode of the first photosensitive sensor and the anode of the second photosensitive sensor are independent of each other, and the intrinsic layer of the first photosensitive sensor and the intrinsic layer of the second photosensitive sensor are formed integrally, so as to increase the photosensitive area of the photosensitive unit as possible.

Figure 4:
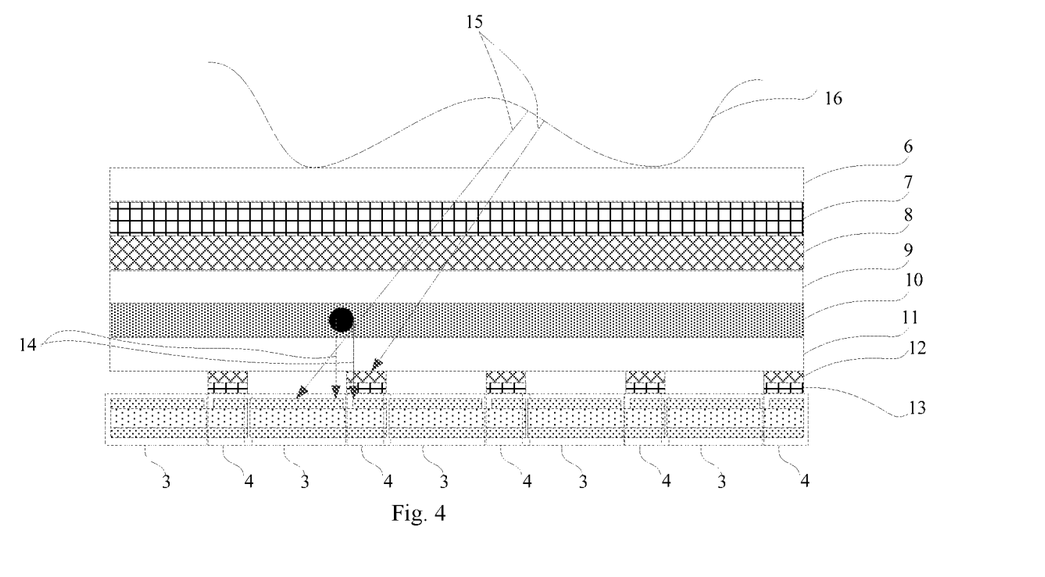
FIG. 4 is a sectional view of the fingerprint identification substrate according to one embodiment of the present disclosure.

In a possible embodiment of the present disclosure, the fingerprint identification substrate may be an OLED display substrate, and the point light source may be a pixel of the OLED display substrate. As shown in FIG. 4, the fingerprint identification substrate includes: a base substrate 11; a pixel 10 on the base substrate 11; an encapsulation thin film 9 covering the pixel 10; a quarter-wave plate 8 and a linear polarizer 7 arranged on the encapsulation thin film 9; an encapsulation cover plate 6; and a plurality of photosensitive units 5 arranged at a side of the base substrate 11 away from the pixel 10. Each photosensitive unit 5 includes a first photosensitive sensor 3 and a second photosensitive sensor 4. A quarter-wave plate 12 and a linear polarizer 13 are arranged between the second photosensitive sensor 4 and the base substrate 11.

In the embodiments of the present disclosure, since the quarter-wave plate and the linear polarizer are arranged at a light-exiting side of the fingerprint identification substrate, the light filtration structure may include the quarter-wave plate and the linear polarizer laminated one on another for converting the signal light into circularly-polarized light. When the fingerprint identification substrate includes the other structure, the light filtration structure may also include any other structure such as a grating, as long as merely the light in the first direction is allowed to pass therethrough.

When a touch operation occurs, two adjacent point light sources are enabled sequentially. When the first point light source is enabled, light 14 in the first direction from the first point light source directly reaches the first photosensitive unit below the point light source. The first photosensitive unit includes a first photosensitive sensor 3 and a second photosensitive sensor 4, the first photosensitive unit is located in the non-imaging region of the first point light source, and imaging data is not adversely affected by an electric signal of the first photosensitive unit. However, due to the light from the first point light source, the electric signal is also generated by the first photosensitive sensor 3 and the second photosensitive sensor 4 of the first photosensitive unit. When the second point light source is enabled, the first photosensitive unit is located in the imaging region of the second point light source. Light from the second point light source passes through the quarter-wave plate 8 and the linear polarizer 7 and becomes circularly-polarized light. The circularly-polarized light is reflected by a fingerprint 16 toward the first photosensitive unit. Because the quarter-wave plate 12 and the linear polarizer 13 are arranged above the second photosensitive sensor 4, this part of circularly-polarized light is blocked, and it merely reaches the first photosensitive sensor 3 of the first photosensitive unit. At this time (the first point light source is disabled and the second point light source is enabled), the electric signal of the second photosensitive sensor 4 of the first photosensitive unit is a residual electric signal generated when the first point light source is enabled, and the electric signal of the first photosensitive sensor 3 of the first photosensitive unit is a sum of a residual electric signal lag generated when the first point light source is enabled and a fingerprint electric signal generated when the second point light source is enabled. A mapping relationship between the residual electric signal of the first photosensitive sensor 3 and the residual electric signal of the second photosensitive sensor 4 in the same photosensitive unit may be obtained in advance, the residual electric signal of the first photosensitive sensor 3 may be obtained in accordance with the residual electric signal of the second photosensitive sensor 4 and the mapping relationship, and then the fingerprint electric signal generated by the first photosensitive sensor 3 may be obtained when the second point light source is enabled. As a result, it is able to eliminate the influence of the lag on the imaging.

The mapping relationship between the residual electric signal of the second photosensitive sensor and the residual electric signal of the first photosensitive sensor in the first photosensitive unit is related to a proportion of the photosensitive area of the second photosensitive sensor to the photosensitive area of the second photosensitive sensor.

The mapping relationship may be obtained when the fingerprint identification substrate leaves the factory. To be specific, the fingerprint identification substrate is adjusted in such a manner as to emit light through a point light source. One point light source is enabled, and then disabled. The residual electric signals of the first photosensitive sensor 3 and the second photosensitive sensor 4 of the photosensitive unit in the non-imaging region of the point light source are recorded to obtain the mapping relationship for this photosensitive unit. All the point light sources and all the photosensitive units are traversed to obtain the mapping relationship for all the photosensitive units.

The present disclosure further provides in some embodiments a display device, which includes the above-mentioned fingerprint identification substrate. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, such as television, display, digital photo frame, mobile phone or tablet computer. The display device further includes a flexible circuit board, a printed circuit board and a back plate.

Figure 5:
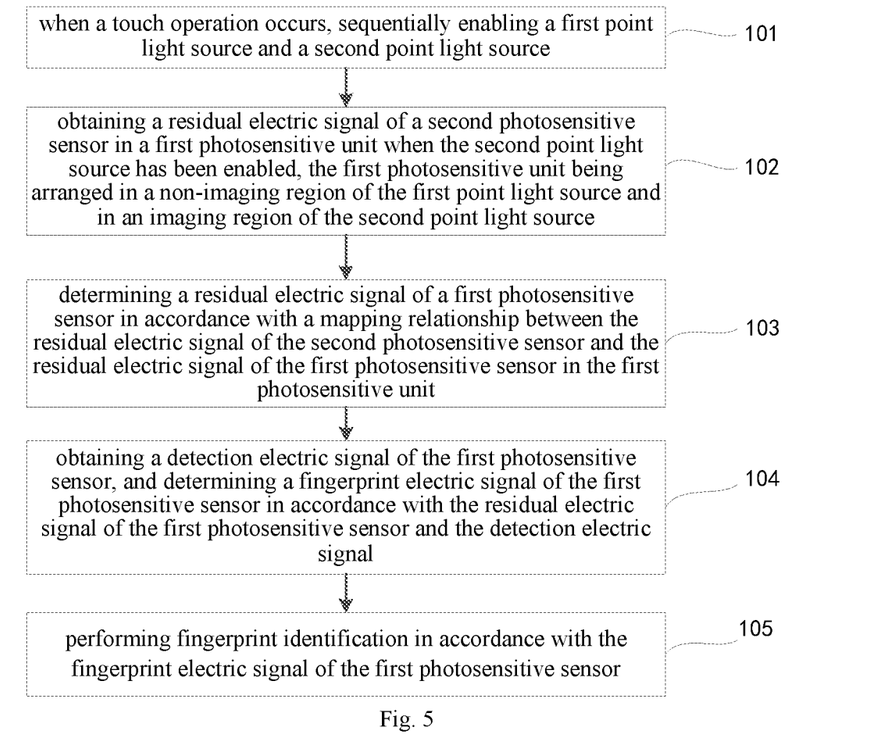
FIG. 5 is a flow chart of a fingerprint identification method according to one embodiment of the present disclosure.

The present disclosure further provides in some embodiments a fingerprint identification method for the above-mentioned fingerprint identification substrate which, as shown in FIG. 5, includes: Step 101 of, when a touch operation occurs, sequentially enabling a first point light source and a second point light source; Step 102 of, obtaining a residual electric signal of a second photosensitive sensor in a first photosensitive unit when the second point light source has been enabled, the first photosensitive unit being arranged in a non-imaging region of the first point light source and in an imaging region of the second point light source; Step 103 of determining a residual electric signal of a first photosensitive sensor in accordance with a mapping relationship between the residual electric signal of the second photosensitive sensor and the residual electric signal of the first photosensitive sensor in the first photosensitive unit; Step 104 of obtaining a detection electric signal of the first photosensitive sensor, and determining a fingerprint electric signal of the first photosensitive sensor in accordance with the residual electric signal of the first photosensitive sensor and the detection electric signal; and Step 105 of performing fingerprint identification in accordance with the fingerprint electric signal of the first photosensitive sensor.

A photosensitive area of the first photosensitive sensor is larger than a photosensitive area of the second photosensitive sensor.

A mapping relationship between the residual electric signal of the second photosensitive sensor and the residual electric signal of the first photosensitive sensor in the first photosensitive unit is related to a proportion of the photosensitive area of the second photosensitive sensor to the photosensitive area of the second photosensitive sensor.

In the embodiments of the present disclosure, each photosensitive unit includes a first photosensitive sensor and a second photosensitive sensor independent of each other. The light filtration structure is arranged at a side of the second photosensitive sensor facing the point light source and configured to merely allow light in the first direction to pass therethrough, and the first direction is perpendicular to the base substrate. When a touch operation occurs, a first point light source and a second point light source are sequentially enabled. A non-imaging region corresponding to the first point light source covers an imaging region corresponding to the second point light source. When the second point light source is enabled, a residual electric signal of a second photosensitive sensor in the first photosensitive unit is obtained. The first photosensitive unit is arranged in the non-imaging region of the first point light source and in the imaging region of the second point light source. The light filtration structure is arranged at a side of the second photosensitive sensor in the first photosensitive unit facing the point light source, and the light filtration structure only allows the light in the first direction to pass therethrough.

Hence, when the second point light source is enabled, light emitted by the second point light source and light reflected by a fingerprint do not reach the second photosensitive sensor, and the electric signal of the second photosensitive sensor is a residual electric signal generated on the second photosensitive sensor when the first point light source is enabled. In this way, through detecting the electric signal of the second photosensitive sensor, it is able to obtain the residual electric signal of the second photosensitive sensor, and then obtain the residual electric signal of the first photosensitive sensor in accordance with the residual electric signal of the second photosensitive sensor. The electric signal of the first photosensitive sensor is detected, and the electric signal of the first photosensitive sensor consists of the residual electric signal and a fingerprint electric signal. The fingerprint electric signal of the first photosensitive sensor is determined in accordance with the residual electric signal of the first photosensitive sensor and the detected electric signal of the first photosensitive sensor, and then fingerprint identification is performed in accordance with the fingerprint electric signal of the first photosensitive sensor.

In a possible embodiment of the present disclosure, the fingerprint identification substrate may be an OLED display substrate, and the point light source may be a pixel of the OLED display substrate. As shown in FIG. 4, the fingerprint identification substrate includes: a base substrate 11; a pixel 10 on the base substrate 11; an encapsulation thin film 9 covering the pixel 10; a quarter-wave plate 8 and a linear polarizer 7 arranged on the encapsulation thin film 9; an encapsulation cover plate 6; and a plurality of photosensitive units 5 arranged at a side of the base substrate 11 away from the pixel 10. Each photosensitive unit 5 includes a first photosensitive sensor 3 and a second photosensitive sensor 4. A quarter-wave plate 12 and a linear polarizer 13 are arranged between the second photosensitive sensor 4 and the base substrate 11.

When a touch operation occurs, two adjacent point light sources are enabled sequentially. When the first point light source is enabled, light 14 in the first direction from the first point light source directly reaches the first photosensitive unit below the point light source. The first photosensitive unit includes a first photosensitive sensor 3 and a second photosensitive sensor 4, the first photosensitive unit is located in the non-imaging region of the first point light source, and imaging data is not adversely affected by an electric signal of the first photosensitive unit. However, due to the light from the first point light source, the electric signal is also generated by the first photosensitive sensor 3 and the second photosensitive sensor 4 of the first photosensitive unit. When the second point light source is enabled, the first photosensitive unit is located in the imaging region of the second point light source. Light from the second point light source passes through the quarter-wave plate 8 and the linear polarizer 7 and becomes circularly-polarized light. The circularly-polarized light is reflected by a fingerprint 16 toward the first photosensitive unit. Because the quarter-wave plate 12 and the linear polarizer 13 are arranged above the second photosensitive sensor 4, this part of circularly-polarized light is blocked, and it merely reaches the first photosensitive sensor 3 of the first photosensitive unit. At this time (the first point light source is disabled and the second point light source is enabled), the electric signal of the second photosensitive sensor 4 of the first photosensitive unit is a residual electric signal generated when the first point light source is enabled, and the electric signal of the first photosensitive sensor 3 of the first photosensitive unit is a sum of a residual electric signal lag generated when the first point light source is enabled and a fingerprint electric signal generated when the second point light source is enabled. A mapping relationship between the residual electric signal of the first photosensitive sensor 3 and the residual electric signal of the second photosensitive sensor 4 in the same photosensitive unit may be obtained in advance, the residual electric signal of the first photosensitive sensor 3 may be obtained in accordance with the residual electric signal of the second photosensitive sensor 4 and the mapping relationship, and then the fingerprint electric signal generated by the first photosensitive sensor 3 may be obtained when the second point light source is enabled. As a result, it is able to eliminate the influence of the lag on the imaging.

The fingerprint identification method further includes obtaining the mapping relationship between the residual electric signal of the second photosensitive sensor and the residual electric signal of the first photosensitive sensor in each photosensitive unit.

To be specific, the obtaining the mapping relationship includes: step a of enabling a point light source and disabling the point light source; step b of measuring a first residual electric signal of a first photosensitive sensor of a second photosensitive unit, the second photosensitive unit being arranged in the non-imaging region of the point light source; step c of measuring a second residual electric signal of a second photosensitive sensor of the second photosensitive unit; step d of determining a mapping relationship for the second photosensitive unit according to the first residual electric signal and the second residual electric signal; and repeating steps a to d until the mapping relationship for all the photosensitive units of the fingerprint identification substrate has been obtained.

In the embodiments of the present disclosure, the order of the steps is not limited to the serial numbers thereof. For a person skilled in the art, any change in the order of the steps shall also fall within the scope of the present disclosure if without any creative effort.

It should be appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A fingerprint identification substrate, comprising:
a base substrate;
at least one point light source arranged on the base substrate and configured to emit signal light; and
at least one photosensitive unit arranged at a side of the base substrate away from the point light source, and configured to receive the signal light reflected by a finger and identify a fingerprint,
wherein each photosensitive unit comprises a first photosensitive sensor and a second photosensitive sensor independent of each other, a light filtration structure is arranged at a side of the second photosensitive sensor facing the point light source and configured to only allow light in a first direction to pass therethrough, and the first direction is perpendicular to the base substrate,
wherein the light filtration structure comprises a quarter-wave plate and a linear polarizer laminated one on another.

2. The fingerprint identification substrate according to claim 1, wherein a photosensitive area of the first photosensitive sensor is larger than a photosensitive area of the second photosensitive sensor.

3. The fingerprint identification substrate according to claim 1, wherein the photosensitive units correspond to the point light sources respectively.

4. The fingerprint identification substrate according to claim 1, wherein the first photosensitive sensor and the second photosensitive sensor are photodiodes, each photodiode comprises an anode, a cathode and an intrinsic layer between the anode and the cathode, the anode of the first photosensitive sensor and the anode of the second photosensitive sensor are independent of each other, and the intrinsic layer of the first photosensitive sensor and the intrinsic layer of the second photosensitive sensor are formed integrally.

5. The fingerprint identification substrate according to claim 1, wherein the fingerprint identification substrate is an organic light-emitting diode (OLED) display substrate, and the point light source is a pixel of the OLED display substrate.

6. The fingerprint identification substrate according to claim 1, wherein a quarter-wave plate and a linear polarizer are arranged on an encapsulation thin film at a light-exiting side of the fingerprint identification substrate to convert the signal light into circularly-polarized light.

7. A display device, comprising the fingerprint identification substrate according to claim 1.

8. A fingerprint identification method for the fingerprint identification base substrate according to claim 1, comprising:
when a touch operation occurs, sequentially enabling a first point light source and a second point light source;
obtaining a residual electric signal of a second photosensitive sensor in a first photosensitive unit when the second point light source has been enabled, the first photosensitive unit being arranged in a non-imaging region of the first point light source and in an imaging region of the second point light source;

determining a residual electric signal of a first photosensitive sensor in accordance with a mapping relationship between the residual electric signal of the second photosensitive sensor and the residual electric signal of the first photosensitive sensor in the first photosensitive unit;

obtaining a detection electric signal of the first photosensitive sensor, and determining a fingerprint electric signal of the first photosensitive sensor in accordance with the residual electric signal of the first photosensitive sensor and the detection electric signal; and performing fingerprint identification in accordance with the fingerprint electric signal of the first photosensitive sensor.

9. The fingerprint identification method according to claim 8, wherein a photosensitive area of the first photosensitive sensor is larger than a photosensitive area of the second photosensitive sensor.

10. The fingerprint identification method according to claim 9, wherein the mapping relationship between the residual electric signal of the second photosensitive sensor and the residual electric signal of the first photosensitive sensor in the first photosensitive unit is related to a proportion of the photosensitive area of the second photosensitive sensor to the photosensitive area of the second photosensitive sensor.

11. The fingerprint identification method according to claim 8, further comprising obtaining the mapping relationship between the residual electric signal of the second photosensitive sensor and the residual electric signal of the first photosensitive sensor in each photosensitive unit.

12. The fingerprint identification method according to claim 8, wherein the obtaining the mapping relationship comprises:

step a of enabling a point light source and disabling the point light source;

step b of measuring a first residual electric signal of a first photosensitive sensor of a second photosensitive unit, the second photosensitive unit being arranged in the non-imaging region of the point light source;

step c of measuring a second residual electric signal of a second photosensitive sensor of the second photosensitive unit;

step d of determining a mapping relationship for the second photosensitive unit according to the first residual electric signal and the second residual electric signal; and repeating steps a to d until the mapping relationship for all the photosensitive units of the fingerprint identification substrate has been obtained.

13. The display device according to claim 7, wherein a photosensitive area of the first photosensitive sensor is larger than a photosensitive area of the second photosensitive sensor.

14. The display device according to claim 7, wherein the photosensitive units correspond to the point light sources respectively.

15. The display device according to claim 7, wherein the first photosensitive sensor and the second photosensitive sensor are photodiodes, each photodiode comprises an anode, a cathode and an intrinsic layer between the anode and the cathode, the anode of the first photosensitive sensor and the anode of the second photosensitive sensor are independent of each other, and the intrinsic layer of the first photosensitive sensor and the intrinsic layer of the second photosensitive sensor are formed integrally.

16. The display device according to claim 7, wherein the fingerprint identification substrate is an OLED display substrate, and the point light source is a pixel of the OLED display substrate.

17. The display device according to claim 7, wherein a quarter-wave plate and a linear polarizer are arranged on an encapsulation thin film at a light-exiting side of the fingerprint identification substrate to convert the signal light into circularly-polarized light.

18. A fingerprint identification substrate, comprising:

a base substrate;

at least one point light source arranged on the base substrate and configured to emit signal light; and at least one photosensitive unit arranged at a side of the base substrate away from the point light source, and configured to receive the signal light reflected by a finger and identify a fingerprint, wherein each photosensitive unit comprises a first photosensitive sensor and a second photosensitive sensor independent of each other, a light filtration structure is arranged at a side of the second photosensitive sensor facing the point light source and configured to only allow light in a first direction to pass therethrough, and the first direction is perpendicular to the base substrate, wherein the first photosensitive sensor and the second photosensitive sensor are photodiodes, each photodiode comprises an anode, a cathode and an intrinsic layer between the anode and the cathode, the anode of the first photosensitive sensor and the anode of the second photosensitive sensor are independent of each other, and the intrinsic layer of the first photosensitive sensor and the intrinsic layer of the second photosensitive sensor are formed integrally.

19. A fingerprint identification substrate, comprising:

a base substrate;

at least one point light source arranged on the base substrate and configured to emit signal light; and at least one photosensitive unit arranged at a side of the base substrate away from the point light source, and configured to receive the signal light reflected by a finger and identify a fingerprint, wherein each photosensitive unit comprises a first photosensitive sensor and a second photosensitive sensor independent of each other, a light filtration structure is arranged at a side of the second photosensitive sensor facing the point light source and configured to only allow light in a first direction to pass therethrough, and the first direction is perpendicular to the base substrate, wherein a quarter-wave plate and a linear polarizer are arranged on an encapsulation thin film at a light-exiting side of the fingerprint identification substrate to convert the signal light into circularly-polarized light.

* * * * *